(12) United States Patent
Hong et al.

(10) Patent No.: US 6,797,451 B2
(45) Date of Patent: Sep. 28, 2004

(54) REFLECTION-INHIBITING RESIN USED IN PROCESS FOR FORMING PHOTORESIST PATTERN

(75) Inventors: Sung Eun Hong, Sungnam-shi (KR); Min Ho Jung, Ichon-shi (KR); Hyeong Soo Kim, Ichon-shi (KR); Jae Chang Jung, Ichon-shi (KR); Ki Ho Baik, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/189,056

(22) Filed: Jul. 3, 2002

(65) Prior Publication Data

US 2003/0018150 A1 Jan. 23, 2003

Related U.S. Application Data

(63) Continuation-in-part of application No. 09/627,713, filed on Jul. 28, 2000, now abandoned.

(30) Foreign Application Priority Data

Jul. 30, 1999 (KR) ............................................. 99-31300

(51) Int. Cl.$^7$ ................................................ G03C 1/76
(52) U.S. Cl. ................................ 430/270.1; 430/280.1; 430/281.1; 430/910; 430/921; 430/325; 430/327; 430/330; 522/59; 522/68; 522/149; 525/286; 525/426; 525/502; 526/273
(58) Field of Search .......................... 430/270.1, 280.1, 430/281.1, 910, 921, 325, 327, 330; 522/59, 68, 149, 286; 525/286, 426, 502; 526/273; 428/447, 901

(56) References Cited

U.S. PATENT DOCUMENTS

| | | | |
|---|---|---|---|
| 5,270,353 A | | 12/1993 | Nakano et al. |
| 5,418,286 A | | 5/1995 | Takahashi et al. |
| 5,650,261 A | * | 7/1997 | Winkle ..................... 430/270.1 |
| 5,733,704 A | * | 3/1998 | Choi et al. ............... 430/270.1 |
| 5,804,354 A | * | 9/1998 | Watanabe et al. ........... 430/325 |
| 5,876,899 A | * | 3/1999 | Szmanda et al. ......... 430/270.1 |
| 5,895,800 A | * | 4/1999 | Kataoka et al. ............. 525/286 |
| 6,001,488 A | * | 12/1999 | Kataoka et al. ............. 428/447 |
| 6,004,724 A | * | 12/1999 | Yamato et al. ........... 430/281.1 |
| 6,017,675 A | * | 1/2000 | Dietliker et al. ......... 430/270.1 |
| 6,114,085 A | * | 9/2000 | Padmanaban et al. ... 430/270.1 |
| 6,492,092 B1 | * | 12/2002 | Foster et al. ............. 430/271.1 |
| 6,605,394 B2 | * | 8/2003 | Montgomery et al. ......... 430/5 |
| 2002/0081504 A1 | * | 6/2002 | Kong et al. .................... 430/18 |

FOREIGN PATENT DOCUMENTS

| | | | |
|---|---|---|---|
| DE | 3601 423 A1 | | 7/1987 |
| JP | 57-52049 | | 3/1982 |
| JP | 57-185036 | | 11/1982 |
| JP | 06043653 | * | 2/1994 |
| JP | 11072921 | * | 3/1999 |

* cited by examiner

*Primary Examiner*—Tatyana Zalukaeva
(74) *Attorney, Agent, or Firm*—Townsend and Townsend and Crew LLP

(57) ABSTRACT

The present invention provides a resin of the formula:

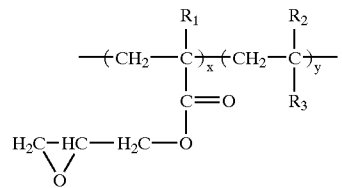

where $R_1$, $R_2$, $R_3$, x and y are those defined herein. The present invention also provides methods for using the above described resin to inhibit reflection of light from the lower layer of a wafer substrate during a photoresist pattern formation process.

9 Claims, 4 Drawing Sheets

REFLECTION-INHIBITING RESIN USED IN PROCESS FOR FORMING PHOTORESIST PATTERN

CROSS-REFERENCES TO RELATED APPLICATIONS

This is a Continuation-In-Part application of U.S. patent application Ser. No. 09/627,713, filed Jul. 28, 2000 now abandoned, which claims priority benefit of Korean Patent Application No. 99-31300, filed Jul. 30, 1999, all of which are incorporated herein by reference in their entirety.

FIELD OF THE INVENTION

The present invention relates to a resin and a process for using the same in forming a photoresist pattern. In particular, the present invention relates to a resin for reducing or inhibiting the amount of light reflecting from the lower film layer of a wafer (i.e., semiconductor substrate).

BACKGROUND OF THE INVENTION

During a photoresist pattern formation step in a semiconductor fabrication process, standing wave effect and reflective notching phenomenon occur due to variations in the optical properties and the thickness of a layer of film coated below the photoresist layer and the photoresist layer itself. In addition, a change in the critical dimension (CD) can occur due to diffracted and reflected light from the lower layer. Accordingly, a reflection-inhibiting film that is capable of absorbing the reflected light is often coated on to the substrate below the photoresist layer. The reflection-inhibiting film includes a material which has a high absorbance of the wavelength of light used in the photoresist pattern formation.

A reflection-inhibiting film can be generally classified as an "organic" film or an "inorganic" film according to the type of materials used. The reflection-inhibiting film can also be catagorized as an "absorption-type" or an "interference-type" film.

The process for forming a photoresist pattern using i-line (365 nm) radiation has typically used an inorganic reflection-inhibiting film. For example, TiN and amorphous carbon (a-C) are typically used for absorption-type reflection-inhibiting films and SiON is generally used as interference-type reflection-inhibiting films. In a photoresist pattern formation using KrF (248 nm) radiation, an inorganic reflection-inhibiting film, SiON, is typically used but an organic reflection-inhibiting film has also been used.

However, a suitable reflection-inhibiting film has not been developed for a photoresist pattern formation process using ArF (193 nm) radiation. To date, it is believed that an inorganic reflection-inhibiting film for controlling interference of a 193 nm wavelength (e.g., ArF light source) has not been disclosed. Currently, extensive efforts are directed to developing an organic substance that can be used as a reflection-inhibiting film.

The basic requirements for a conventional KrF organic reflection-inhibiting film are: first, the reflection-inhibiting film must not be dissolved or removed during the process by the solvent used in the photoresist composition. Therefore, the reflection-inhibiting film is designed to form a cross-linked structure without generating chemical substances.

Second, chemical substances, such as acids and bases (e.g., amines), must not migrate through the reflection-inhibiting film. When an acid migrates from the reflection-inhibiting film, a phenomenon known as "undercutting" takes place at the lower portion of the pattern. When a base such as an amine migrates, it may cause a "footing" phenomenon in the pattern.

Third, the reflection-inhibiting film must have higher etching speed than the photosensitive film above it so that the etching process can be performed smoothly using a photosensitive film as a mask.

Fourth, the reflection-inhibiting film must inhibit reflection with only a thin layer.

Accordingly, the present inventors have developed a resin for reflection-inhibiting film that satisfies all of the aforementioned requirements and can be used in a process for forming the photoresist pattern of a semiconductor device employing an ArF light source.

SUMMARY OF THE INVENTION

It is therefore an object of the present invention to provide a resin for reflection-inhibiting films (also referred to as a polymer) that can inhibit reflection from a lower layer during an ArF light source mediated photoresist pattern formation step in a semiconductor fabrication process.

In order to achieve the above-described object of the present invention, there is provided a novel polymer comprising a phenyl group with high absorbency of 193 nm wavelength light and an epoxy group that enables cross-linkages to be formed during a hard baking step after the resin is coated on to the semiconductor wafer.

DETAILED DESCRIPTION OF THE INVENTION

Figure 1:
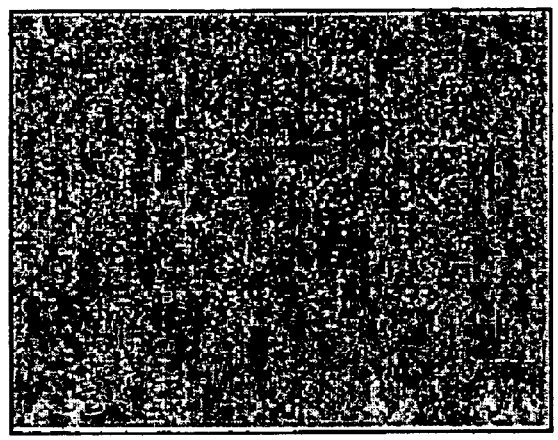
FIG. 1 is a photograph showing a pattern formed without the use of a reflection-inhibiting film of the present invention.

The present invention provides a resin and a process for using the same in forming a photoresist pattern. In particular, the present invention provides to a resin for reducing or inhibiting the amount of light reflecting from the lower film layer of a wafer during a semiconductor fabrication method. In particular, the present invention provides a polymer that satisfies the requirements of a reflection-inhibiting film by (i) introducing into the polymer structure a phenyl group that increases absorbance of 193 nm wavelength light, and (ii) using an epoxy group in the polymer structure to generate cross-linkages during a hard baking step after the film is coated on the wafer.

The present invention provides a polymer comprising a repeating unit represented by the Chemical Formula 1, which is useful in the reflection-inhibiting film:

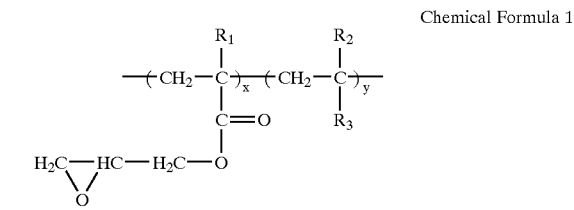

Chemical Formula 1 wherein:

each of $R_1$ and $R_2$ is independently hydrogen, hydroxy, —$CH_2OH$ or —$(CH_2)_nCH_3$;

$R_3$ is

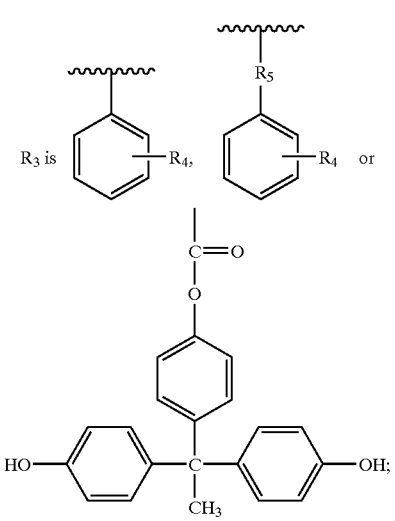

wherein $R_4$ is hydrogen, $-OCH_3$, $-(CH_2)_nCH_3$, $-(CH_2)_n-OH$,

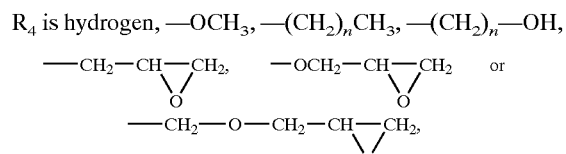

and $R_5$ is $-COO-$ or $-(CH_2)_nCH_2-$;

n is an integer from 0 to 3; and x and y represent the relative amounts of each monomer, wherein the mole ratio of x:y is 0.0–0.9:0.1–1.0; provided that when x=0, then $R_3$ is

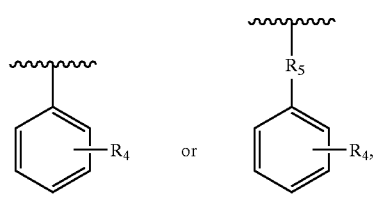

and $R_4$ is

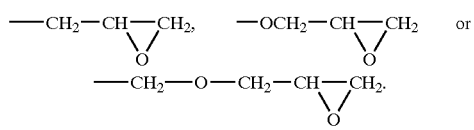

Preferably, $R_4$ is located at the para- position.

The polymer of Chemical Formula 1 is useful as a reflection-inhibiting film in an ArF semiconductor fabrication process because it has a high absorbency of 193 nm wavelength light due to the presence of one or more phenyl groups.

In addition, polymers of the present invention comprise an epoxy group which can act as a cross-linking group during a hard baking step. The cross-linking of polymers by the epoxy group provides forming ability, compactness and solubility resistance to the resulting reflection-inhibiting film.

The polymers of Chemical Formula 1 have excellent solubility in most hydrocarbon solvents, but become insoluble after the hard baking step. Thus, they are not affected by the photoresist composition that is coated over the reflection-inhibiting film. In addition, no chemical substances are generated when forming the cross-linked structure, thereby preventing the cutting and footing phenomena during the pattern-forming process. Furthermore, the epoxy group enhances adhesiveness to the lower film. Moreover, the hydroxyl group that is generated in the cross-linking reaction helps to maintain the adhesiveness. Preferably, polymers of the present invention are derived from polymerizing a mixture of monomers comprising an acrylate and a styrene derivatives. Polymers of the present invention also has a higher etching speed than the photoresist film, thereby increasing the etching selection value during the etching step of a semiconductor fabrication process Preferably, the weight average molecular weight of the polymer of Chemical Formula 1 is from about 2,000 to about 50,000, and more preferably from about 10,000 to about 30,000. The molecular weight of the polymer is measured by a Gel Permeation Chromatography (GPC).

Preferably, the polymer of the present invention is selected from the group consisting of Chemical Formulas 2 to 8. And more preferably, the polymer of the present invention is Chemical Formula 3, which comprises both an epoxy group and a hydroxyl group.

Chemical Formula 2

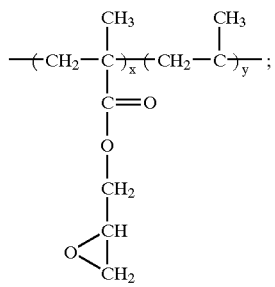

poly(glycidyl methacrylate / α-methyl styrene)

Chemical Formula 3

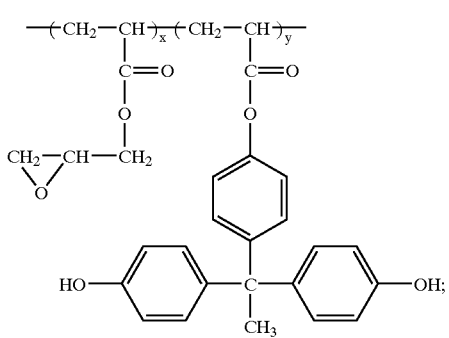

poly(glycidyl acrylate / acryloyl phenoxy bis(4-hydroxy phenyl)ethane)

Chemical Formula 4

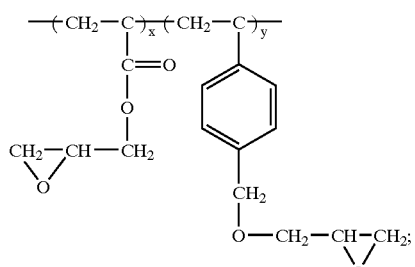

poly(glycidyl methacrylate / glycidyl methyl styrene)

-continued

Chemical Formula 5

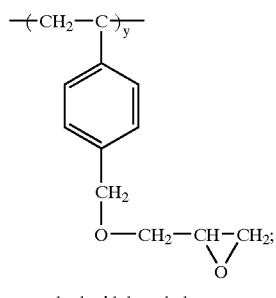

polyglycidyl methyl styrene

Chemical Formula 6

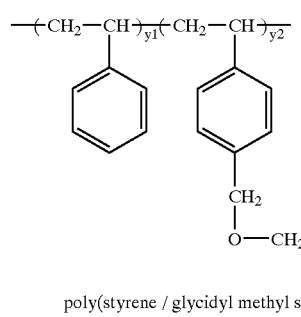

poly(styrene / glycidyl methyl styrene)

Chemical Formula 7

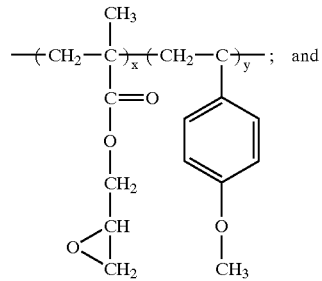  ; and poly(glycidyl methacrylate / vinylanisole)

Chemical Formula 8

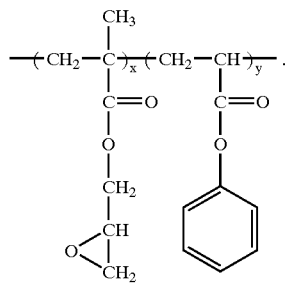.

poly(glycidyl methacrylate / vinylbenzoate)

Polymers of the present invention can be prepared by polymerizing an appropriate monomer mixture using a radical polymerization initiator. Typically, the polymerization reaction is conducted in an organic solvent.

A particularly preferred process for producing polymers of the present invention includes:
(a) dissolving one or more monomers represented by Chemical Formula 10 and optionally one or more monomers represented by Chemical Formula 9 in an organic solvent;
(b) adding a polymerization initiator to the solution resulting from step (a); and
(c) reacting the solution resulting from step (b), preferably under an inert atmosphere, such as a nitrogen or argon atmosphere.

Chemical Formula 9

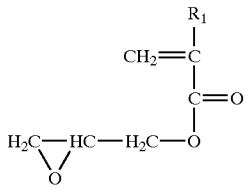

Chemical Formula 10

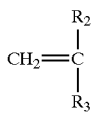

wherein $R_1$, $R_2$, and $R_3$ are those defined above.

The monomers of Chemical Formulas 9 and 10 are preferably used in a ratio of 0.0–0.9 moles of the monomer of Chemical Formula 9 to 0.1–1.0 moles of the monomer of Chemical Formula 10.

The monomers of Chemical Formulas 9 and 10 are inexpensive, and thus economically advantageous. In addition, the monomers are designed to be suitable for mass production.

The radical polymerization process is preferably a solution polymerization process. Preferably, the polymerization solvent is selected from the group consisting of cyclohexanone, tetrahydrofuran, dimethylformamide, dimethylsulfoxide, dioxane, methyl ethyl ketone, benzene, toluene, xylene, and a mixture thereof. Typically, the amount of solvent used in the polymerization reaction is from about 200 to about 5,000% by weight of the polymer.

Preferably, the polymerization initiator is selected from the group consisting of benzoyl peroxide, 2,2'-azobisisobutyronitrile (AIBN), acetyl peroxide, lauryl peroxide, tert-butyl peracetate, tert-butyl hydro peroxide and di-tert-butyl peroxide.

Preferably, the reaction temperature for the polymerization of step (c) is from about 50 to about 80° C. with the reaction time generally ranging from about 5 to about 20 hours.

Another aspect of the present invention provides a light reflection-inhibitor composition for reducing the light reflection in a photoresist pattern formation process. The light reflection-inhibitor composition comprises (a) a polymer comprising a repeating unit of Chemical Formula 1, (b) a thermal acid generator, (c) an organic solvent, and optionally (d) a polymer comprising a hydroxyl functional group. The polymer comprising a hydroxyl group can be omitted when a polymer of Chemical Formula 1 has both epoxy and hydroxyl groups.

The above composition is cured by reacting the epoxy group of the polymer (a) with the hydroxyl group of the polymer (d) in the baking step.

Preferably, the polymer comprising a hydroxyl functional group also comprises an aromatic, preferably phenyl, moiety. More preferably, the phenyl moiety is substituted with the hydroxyl functional group. Still more preferably, the polymer comprising a hydroxyl functional group is a vinyl compound comprising a hydroxy-phenyl (i.e., phenol) substituent. In one particular embodiment, the polymer comprising a hydroxyl group comprises a repeating unit of polyvinyl phenol of Chemical Formula 11:

[Chemical Formula 11]

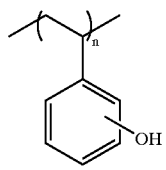

Preferably, the polymer comprising a hydroxyl functional group is used in an amount ranging from about 50 to about 200% by weight of the polymer of Chemical Formula 1.

The thermal acid generator, which is able to generate acid upon heating, is selected from the group consisting of Formulas 12 to 15 shown below. Preferably, the thermal acid generator is used in an amount ranging from about 2 to about 30 wt % of the polymer of Chemical Formula 1.

Formula 12

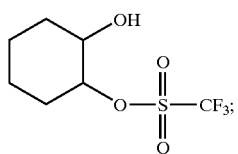

Formula 13

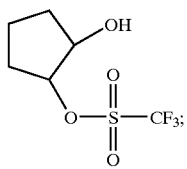

Formula 14

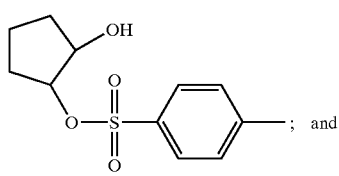

; and

Formula 15

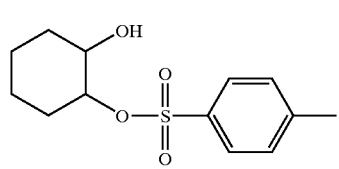

Suitable organic solvents for photoresist compositions of the present invention include propyleneglycol methyl ether acetate (PGMEA), methyl 3-methoxy propionate (MMP), ethyl 3-ethoxypropionate (EEP), cyclohexanone, and mixtures thereof.

The amount of solvent used typically ranges from about 300 to about 7000% by weight of the polymer of Chemical Formula 1.

After the composition for reflection-inhibiting film is coated on the lower layer, it is baked to generate cross-linking bonds between the polymers in the resin. As a result, a reflection-inhibiting film, which is relatively insoluble in an organic solvent, is formed on the wafer.

Another aspect of the present invention provides a process for forming a photoresist pattern, comprising the steps of:

(a) coating the above described light reflection-reducing composition on a semiconductor substrate;

(b) cross-linking the polymer contained in the composition by hard baking it to form a reflection-inhibiting layer;

(c) coating a photoresist composition over the reflection-inhibiting layer to form a photoresist layer;

(d) exposing the photoresist layer to light; and (e) developing the photoresist layer to produce a photoresist pattern.

The present invention also provides a process for forming a pattern in the layer(s) below the photoresist film by adding the following step to the above process:

(f) etching the reflection-inhibiting film using the above photoresist pattern as an etching mask to form a reflection-inhibiting layer pattern.

In the process for pattern formation described above, ArF (193 nm), KrF (248 nm), E-beam, EUV (13 nm), $F_2$ (157 nm) or ion beam can be used as a light source in the exposing step. However, the polymers of the present invention are particularly useful in processes for forming a photoresist pattern using an ArF exposure light source because the reflection-inhibiting films of the present invention inhibit light reflection from the lower layer and provide a critical dimension uniformity, thereby readily forming the photoresist pattern.

Yet another aspect of the present invention provides a semiconductor element wherein a composition containing the polymer of Chemical Formula 1 is coated on a lower layer of the element before the photoresist film is coated thereon.

The present invention will be explained in more detail by referring to the examples below, but it should be noted that the present invention is not restricted to these examples.

First of all, examples of the preparation of the monomers used for preparing the polymers according to the present invention will be described, and then examples of the preparation of the polymers will be given. Here, commercial monomers may replace the monomers used for the present invention, except for the monomer obtained from Preparation Example 1.

I. PREPARATION OF THE MONOMER FOR THE REFLECTION-INHIBITING FILM

PREPARATION EXAMPLE 1

Preparation of Acryloyl Phenoxy Bis(-4-hydroxy Phenyl)Ethane Monomer

Acryloyl chloride (45.3 g, 0.5 mole) was dissolved in 50 g (0.63 mole) of pyridine anhydride in a reaction vessel. The exothermic reaction was cooled by placing the reaction vessel in a liquid nitrogen-isopropyl alcohol bath. Thereafter, 193 g (0.63 mole) of 1,1,1-tris(4-hydroxy phenyl)ethane was added dropwise to the reaction mixture and stirred. After the addition of 1,1,1-tris(4-hydroxy phenyl)ethane, the reaction vessel was removed from the cooling bath, and the reaction was stirred at room temperature for over 24 hours. The progress of the reaction was monitored by TLC. The reaction mixture was transferred to a separatory funnel, neutralized using 1 N aqueous sulfuric acid solution, and extracted with dichloromethane. The organic layer was washed with deionized water, concentrated under reduced pressure, and purified by distillation under reduced pressure to yield acryloyl phenoxy bis(-4-hydroxy phenyl)ethane monomer (yield 85%).

Reaction Scheme 1

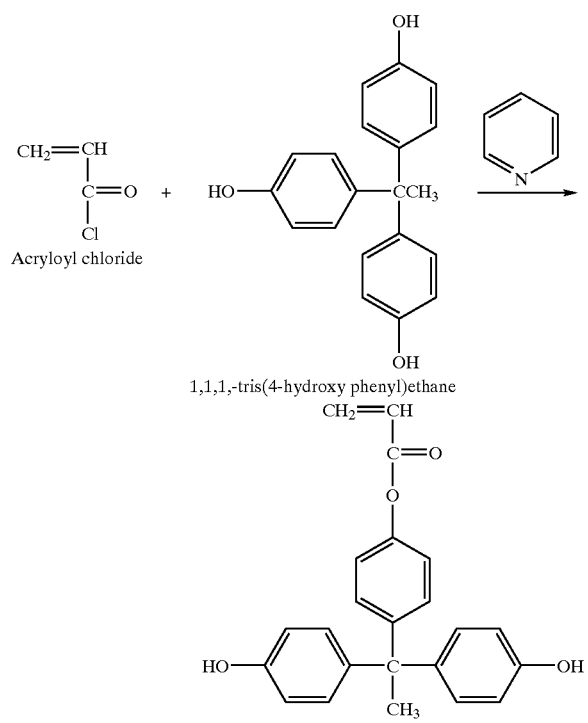

PREPARATION EXAMPLE 2

Preparation of Glycidyl Methacrylate Monomer

Methacrylic acid (34.4 g, 0.4 mole) was dissolved in 50 g (0.63 mole) of pyridine anhydride. The exothermic reaction was cooled by placing the reaction vessel in a liquid nitrogen-isopropyl alcohol bath. Thereafter, 50.8 g (0.55 mole) of epichlorohydrin was added dropwise. The cooling bath was removed, and the reaction mixture was stirred at room temperature for over 36 hours. The reaction was monitored using TLC. The reaction mixture was transferred to a separatory funnel, neutralized using 1 N aqueous sulfuric acid solution, and extracted with dichloromethane. The organic layer was washed with deionized water, concentrated under reduced pressure, and purified by distillation under reduced pressure to provide the product (yield 73%).

Reaction Scheme 2

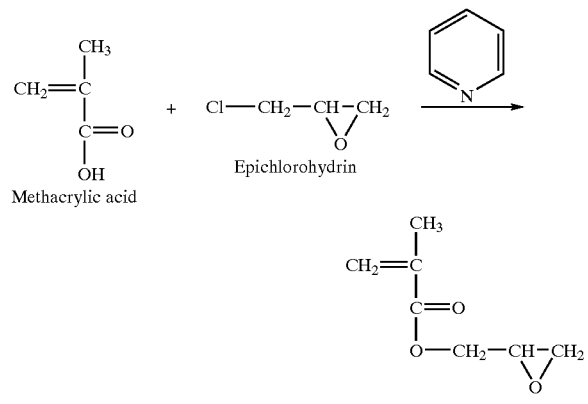

PREPARATION EXAMPLE 3

Preparation of Glycidyl Methyl Styrene Monomer

Glycidol (29.6 g, 0.4 mole) was dissolved in 50 g (0.63 mole) of pyridine anhydride. The exothermic reaction was cooled by placing the reaction vessel in a liquid nitrogen-isopropyl alcohol bath. Thereafter, 4-vinylbenzyl chloride (38.2 g, 0.25 mole) was added dropwise to the reaction mixture. The cooling bath was removed, and the reaction mixture was stirred at room temperature for over 20 hours. The reaction was monitored using TLC. The reaction mixture was transferred to a separatory funnel, neutralized using 1 N aqueous sulfuric acid solution, and extracted with dichloromethane. The organic layer was washed with deionized water, concentrated under reduced pressure, and purified by distillation under reduced pressure to provide glycidyl methyl styrene monomer (yield 82%).

Reaction Scheme 3

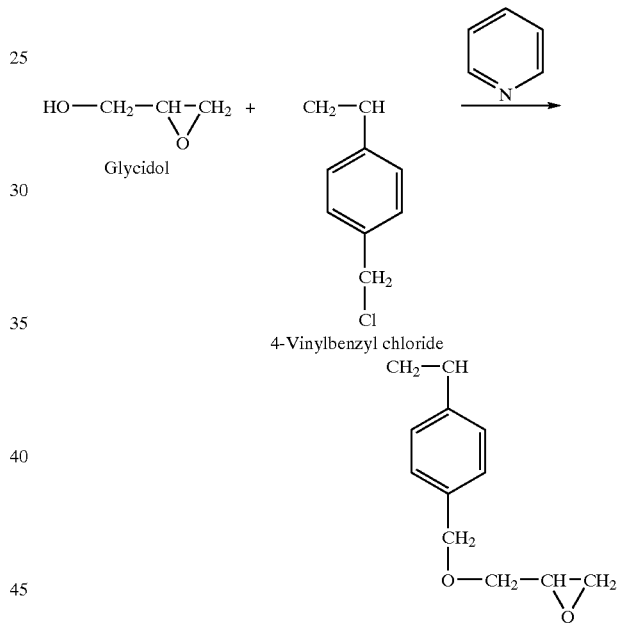

II. PREPARATION OF THE MONOMER FOR THE REFLECTION-INHIBITING FILM

INVENTION EXAMPLE 1

Preparation of Poly(Glycidyl Methacrylate/α-methyl Styrene)

To a solution of glycidyl methacrylate (0.4 mole) and α-methyl styrene (0.55 mole) were in 300 g of tetrahydrofuran (THF) was added 0.3 g of AIBN. The resulting mixture was stirred at 65° C. for 12 hours under nitrogen atmosphere. The polymer was precipitated using n-hexane, filtered and dried to produce the resin of Chemical Formula 2 (yield 76%).

Reaction Scheme 4

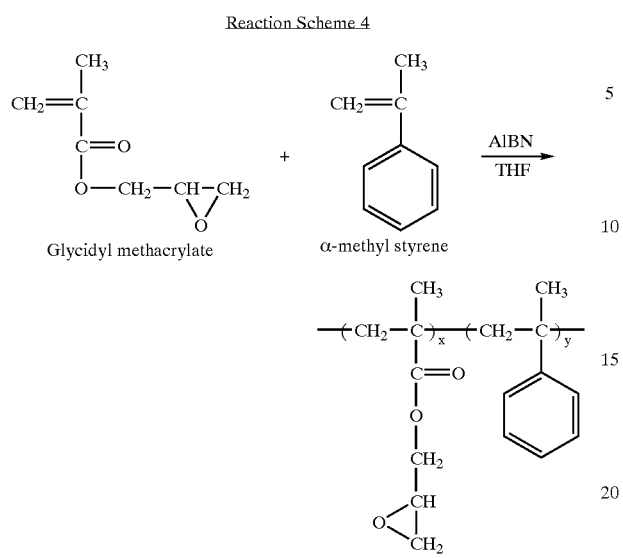

INVENTION EXAMPLE 2

Preparation of Poly(Glycidyl Acrylate/acryloyl Phenoxy Bis(-4-hydroxy Phenyl)Ethane)

To a solution of glycidyl acrylate (0.4 mole) and acryloyl phenoxy bis(-4-hydroxy phenyl)ethane (0.25 mole) in 300 g of THF was added 0.3 g of AIBN. The resulting mixture was stirred at 65° C. for 12 hours under nitrogen atmosphere. The polymer was precipitated using n-hexane, filtered and dried to produce the resin of Chemical Formula 3 (yield 67%).

Reaction Scheme 5

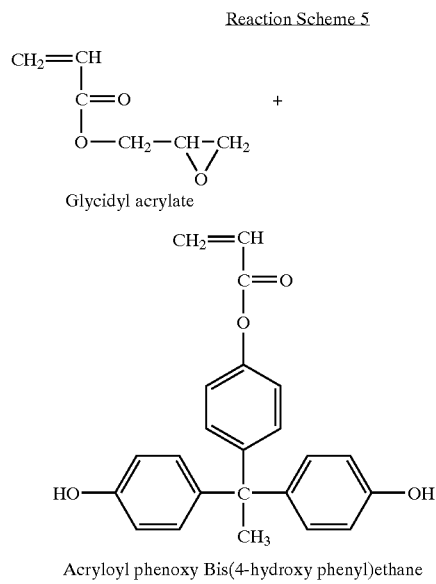

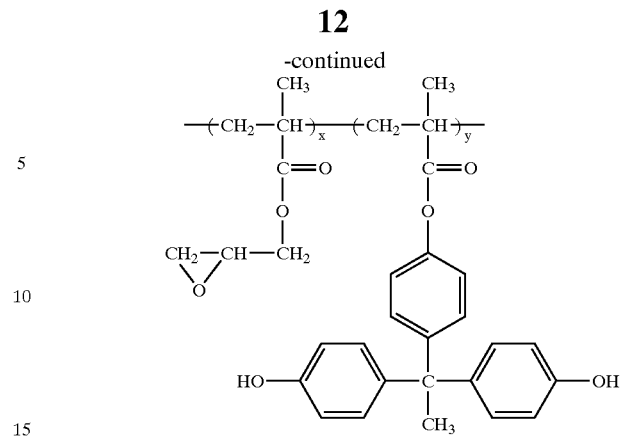

INVENTION EXAMPLE 3

Preparation of Poly(Glycidyl Methacrylate/Glycidyl Methyl Styrene)

To a solution of glycidyl methacrylate (0.3 mole) and glycidyl methyl styrene (0.45 mole) in 300 g of THF was added 0.3 g of AIBN. The resulting mixture was stirred at 65° C. for 12 hours under nitrogen atmosphere. The polymer was precipitated using n-hexane, filtered and dried to produce the resin of Chemical Formula 4 (yield 84%).

Reaction Scheme 6

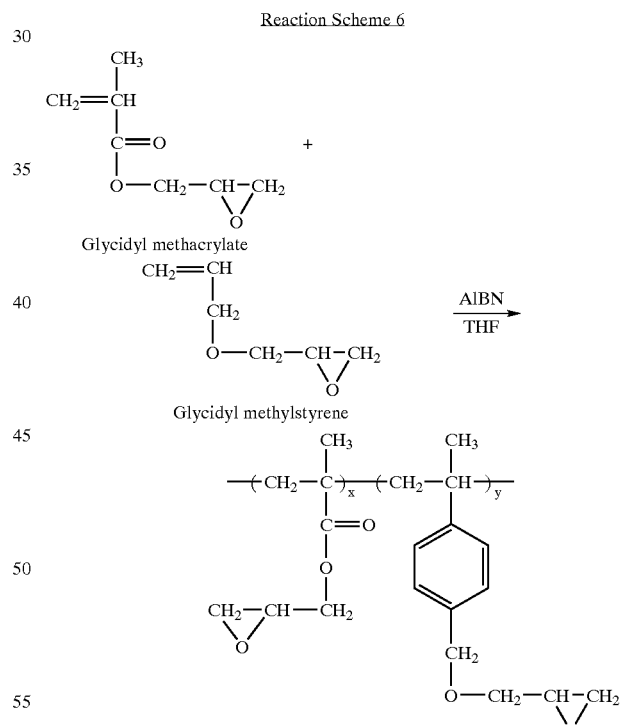

INVENTION EXAMPLE 4

Preparation of Polyglycidyl Methyl Styrene

To a solution of glycidyl methyl styrene (0.5 mole) in 300 g of THF was added 0.3 g of AIBN. The resulting mixture was stirred at 65° C. for 12 hours under nitrogen atmosphere. The polymer was precipitated using n-hexane, filtered and dried to obtain the resin of Chemical Formula 5 (yield 91%).

Reaction Scheme 7

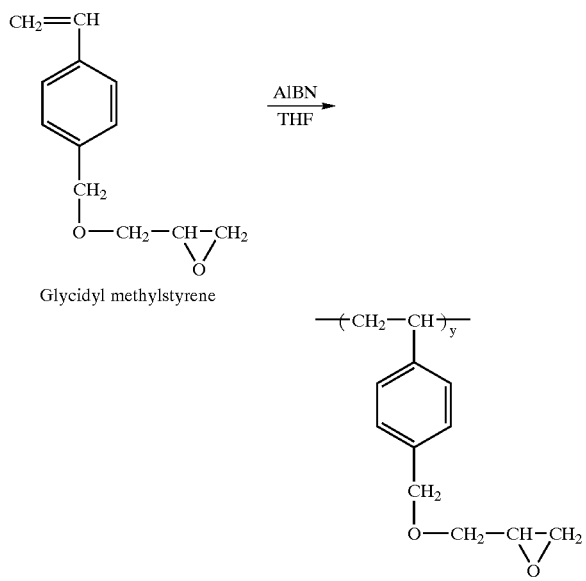

Glycidyl methylstyrene

INVENTION EXAMPLE 5
Preparation of Poly(Styrene/glycidyl Methyl Styrene)

To a solution of styrene (0.4 mole) and glycidyl methyl styrene (0.5 mole) in 300 g of THF was added 0.3 g of AIBN. The resulting mixture was stirred at 65° C. for 12 hours under nitrogen atmosphere. The polymer was precipitated using ethyl ether, filtered and dried to produce the resin of Chemical Formula 6 (yield 75%).

Reaction Scheme 8

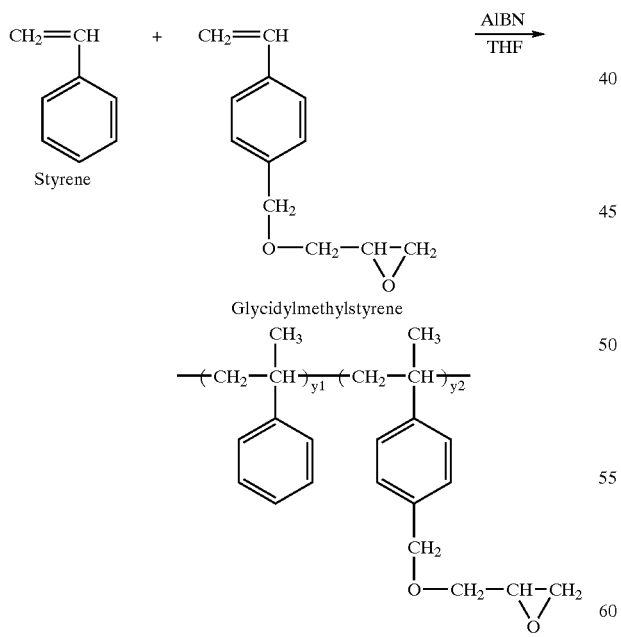

Styrene

Glycidylmethylstyrene

INVENTION EXAMPLE 6
Preparation of Poly(Glycidyl Methacrylate/vinylanisole)

To a solution of glycidyl methacrylate (0.5 mole) and 4-vinylanisole (0.4 mole) in 300 g of THF was added 0.3 g of AIBN. The resulting mixture was stirred at 65° C. for 12 hours under nitrogen atmosphere. The polymer precipitated using n-hexane, filtered and dried to produce the resin of Chemical Formula 7 (yield 80%).

Reaction Scheme 9

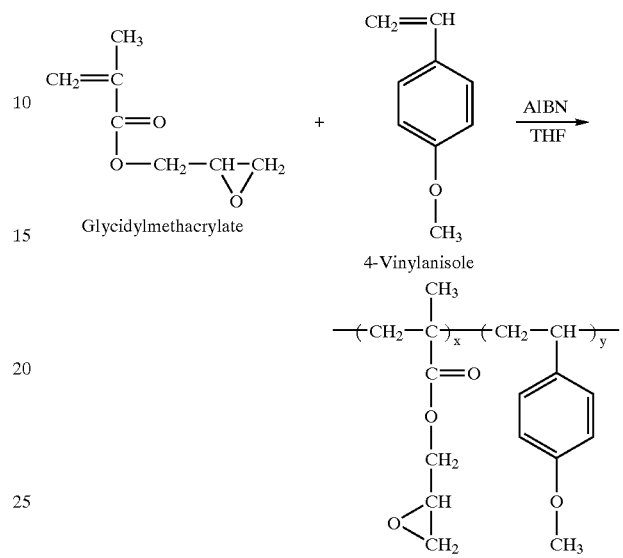

Glycidylmethacrylate

4-Vinylanisole

INVENTION EXAMPLE 7
Preparation of Poly(Glycidyl Methacrylate/vinylbenzoate)

To a solution of glycidyl methacrylate (0.5 mole) and vinylbenzoate (0.4 mole) in 300 g of THF was added 0.3 g of AIBN. The resulting mixture was stirred at 65° C. for 12 hours under nitrogen atmosphere. The polymer was precipitated using n-hexane, filtered and dried to yield the resin of Chemical Formula 8 (yield 74%).

Reaction Scheme 10

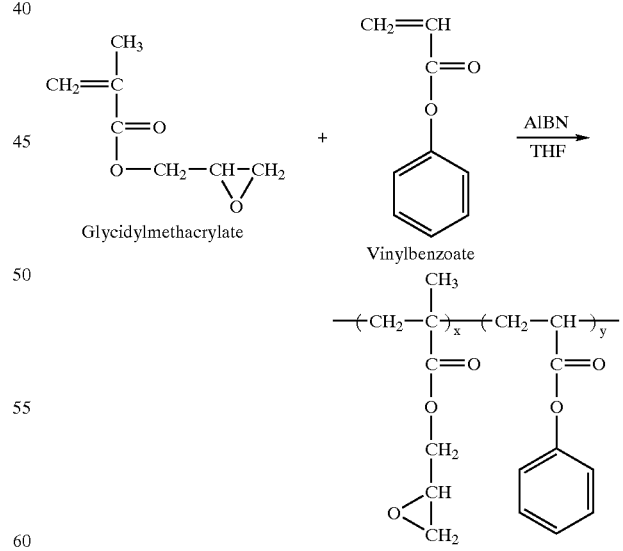

Glycidylmethacrylate

Vinylbenzoate

III. PREPARATION OF THE MONOMER FOR THE REFLECTION-INHIBITING FILM

INVENTION EXAMPLE 8

Figure 2:
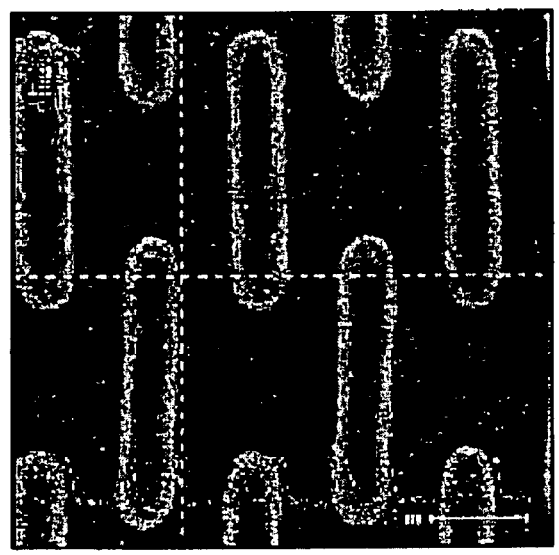
FIGS. 2 to 8 are photographs showing a pattern employing a reflection-inhibiting film of the present invention.

A reflection-inhibiting composition having 50 g of propylene glycol methyl ether acetate (PGMEA), 1 g of the polymer prepared in Invention Example 1, 1 g of polyvinylphenol, and 0.05 g of the compound of Chemical Formula 15 was spin-coated to a thickness of 720 Å onto a 4000 Å thick aluminum layer. The resulting substrate was hard baked at 140° C. for 90 seconds. Thereafter, photoresist composition DHA 1001 (produced by Dongjin Semichem Co., Ltd.) was spin-coated to a thickness of 0.1 μm onto the reflection-inhibiting film, and the resulting substrate was hard baked at 120° C. for 90 seconds. After the baking process, the photoresist was exposed to light using an ArF laser exposer, post-baked at 120° C. for 90 seconds, and developed in 2.38 wt % aqueous TMAH solution for about 40 seconds to produce a pattern (see FIG. 2).

INVENTION EXAMPLE 9

Figure 3:
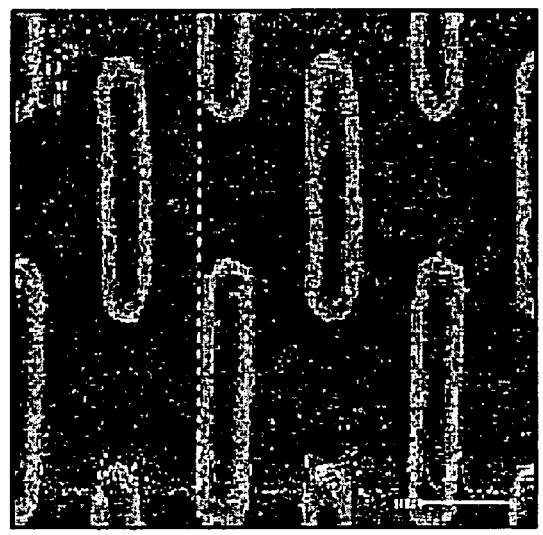

A reflection-inhibiting composition having 50 g of propylene glycol methyl ether acetate (PGMEA), 1 g of the polymer prepared in Invention Example 2, 1 g of polyvinylphenol, and 0.05 g of the compound of Chemical Formula 15 was spin-coated to a thickness of 720 Å on to a 4000 Å thick aluminum layer. The resulting substrate was hard baked at 140° C. for 90 seconds. Thereafter, photoresist composition DHA 1001 was spin-coated to a thickness of 0.1 μm onto the reflection-inhibiting film, and the resulting substrate was hard baked at 120° C. for 90 seconds. After the baking process, the photoresist was exposed to light using an ArF laser exposer, post-baked at 120° C. for 90 seconds, and developed in 2.38 wt % aqueous TMAH solution for about 40 seconds to produce a pattern (see FIG. 3).

INVENTION EXAMPLE 10

Figure 4:
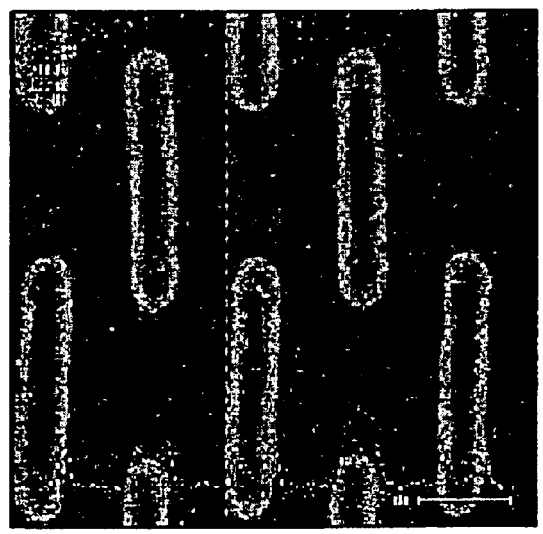

A reflection-inhibiting composition having 50 g of propylene glycol methyl ether acetate (PGMEA), 1 g of the polymer prepared in Invention Example 3, 1 g of polyvinylphenol, and 0.05 g of the compound of Chemical Formula 15was spin-coated to a thickness of 720 Å onto a 4000 Å thick aluminum layer. The resulting substrate was hard baked at 140° C. for 90 seconds. Thereafter, photoresist composition DHA 100 was spin-coated to a thickness of 0.1 μm onto the reflection-inhibiting film, and the resulting substrate was hard baked at 120° C. for 90 seconds. After the baking process, the photoresist was exposed to light using an ArF laser exposer, post-baked at 120° C. for 90 seconds, and developed in 2.38 wt % aqueous TMAH solution for about 40 seconds to produce a pattern (see FIG. 4).

INVENTION EXAMPLE 11

Figure 5:
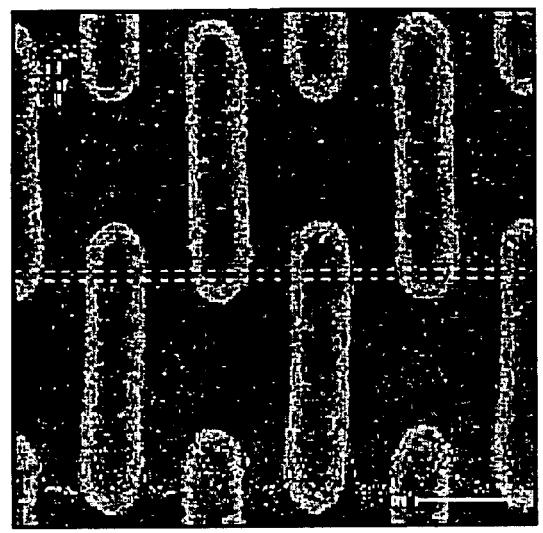

A reflection-inhibiting composition having 50 g of propylene glycol methyl ether acetate (PGMEA), 1 g of the polymer films prepared in Invention Example 4, 1 g of polyvinylphenol, and 0.05 g of the compound of Chemical Formula 15 was spin-coated to a thickness of 720Å onto a 4000 Å thick aluminum layer. The resulting substrate was hard baked at 140° C. for 90 seconds. Thereafter, photoresist composition DHA 1001 was spin-coated to a thickness of 0.1 μm onto the reflection-inhibiting film, and the resulting substrate was hard baked at 120° C. for 90 seconds. After the baking process, the photoresist was exposed to light using an ArF laser exposer, post-baked at 120° C. for 90 seconds, and developed in 2.38 wt % aqueous TMAH solution for about 40 seconds to produce a pattern (see FIG. 5).

INVENTION EXAMPLE 12

Figure 6:
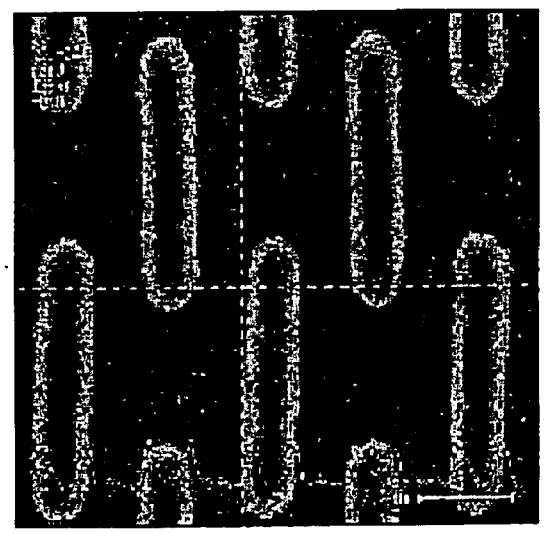

A reflection-inhibiting composition having 50 g of propylene glycol methyl ether acetate (PGMEA), 1 g of the polymer prepared in Invention Example 5, 1 g of polyvinylphenol, and 0.05 g of the compound of Chemical Formula 15 was spin-coated to a thickness of 720 Å onto a 4000 Å thick aluminum layer. The resulting substrate was hard baked at 140° C. for 90 seconds. Thereafter, photoresist composition DHA 1001 was spin-coated to a thickness of 0.1 μm onto the reflection-inhibiting film, and the resulting substrate was hard baked at 120° C. for 90 seconds. After the baking process, the photoresist was exposed to light using an ArF laser exposer, post-baked at 120° C. for 90 seconds, and developed in 2.38 wt % aqueous TMAH solution for about 40 seconds to produce a pattern (see FIG. 6).

INVENTION EXAMPLE 13

Figure 7:
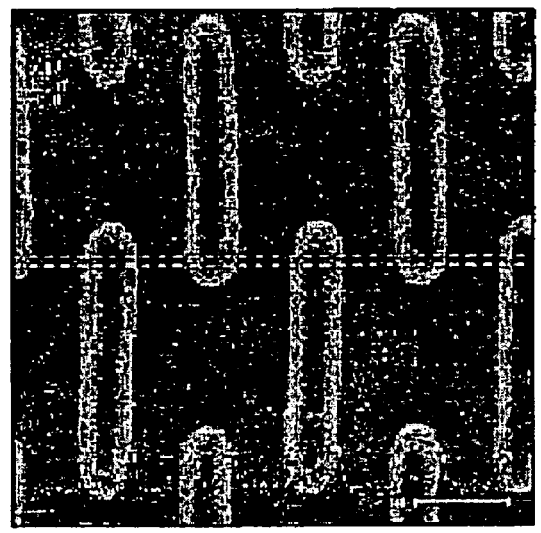

A reflection-inhibiting composition having 50 g of propylene glycol methyl ether acetate (PGMEA), 1 g of the polymer prepared in Invention Example 6, 1 g of polyvinylphenol, and 0.0 5 g of the compound of Chemical Formula 15 was spin-coated to a thickness of 720 Å onto a 4000 Å thick aluminum layer. The resulting substrate was hard baked at 140° C for 90 seconds. Thereafter, photoresist composition DHA 1001 was spin-coated to a thickness of 0.1 μm onto the reflection-inhibiting film, and the resulting substrate was hard baked at 120° C. for 90 seconds. After the baking process, the photoresist was exposed to light using an ArF laser exposer, post-baked at 120° C. for 90 seconds, and developed in 2.38 wt % aqueous TMAH solution for about 40 seconds to produce a pattern (see FIG. 7).

INVENTION EXAMPLE 14

Figure 8:
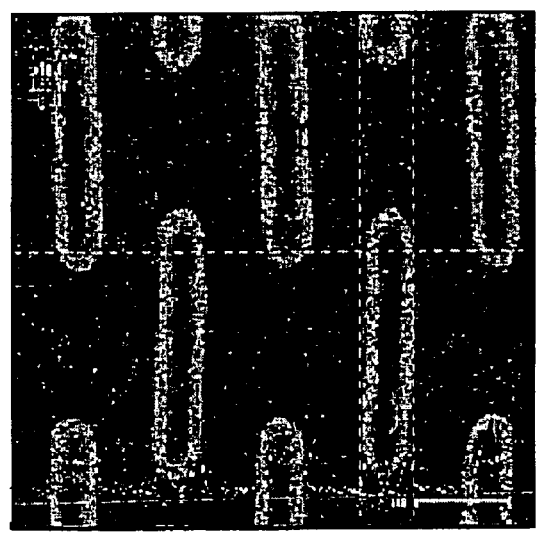

A reflection-inhibiting composition having 50 g of propylene glycol methyl ether acetate (PGMEA), 1 g of the polymer prepared in Invention Example 7, 1 g of polyvinylphenol, and 0.05 g of the compound of Chemical Formula 15 was spin-coated to a thickness of 720 Å onto a 4000Å thick aluminum layer. The resulting substrate was hard baked at 140° C. for 90 seconds. Thereafter, photoresist composition DHA 1001 was spin-coated to a thickness of 0.1 μm onto the reflection-inhibiting film, and the resulting substrate was hard baked at 120° C. for 90 seconds. After the baking process, the photoresist was exposed to light using an ArF laser exposer, post-baked at 120° C. for 90 seconds, and developed in 2.38 wt % aqueous TMAH solution for about 40 seconds to produce a pattern (see FIG. 8).

COMPARATIVE EXAMPLE 1

A pattern formed on a semiconductor device in which the reflection-inhibiting film is not used is shown in FIG. 1. As shown therein, when the reflection-inhibiting film is not used, reflection from the lower film is so serious that a "scum" phenomenon may occur. Therefore, it is very difficult to form a fine photoresist pattern without the reflection-inhibiting film.

IV. THE ABSORBENCY OF THE COMPOSITION FOR REFLECTION-INHIBITING FILMS AT THE 193NM WAVELENGTH.

EXPERIMENTAL EXAMPLE 1

This example shows absorbance of 193 nm wavelength light by the reflection-inhibiting film of the present invention.

The results of an experiment measuring the absorbance at wavelengths of 248 nm and 193 nm of a reflection-inhibiting film (film thickness: 800 Å) of the present invention are shown in Table 1. As shown in Table 1, the absorbance of the composition is maximized at the wavelength of 193 nm.

TABLE 1

| Wavelength | Absorbance of reflection-inhibiting film using the composition of Invention Example 8 | Absorbance of reflection-inhibiting film using the composition of Invention Example 9 |
|---|---|---|
| 248 nm | 0.01 | 0.45 |
| 193 nm | 0.8 | 1.2 |
| λ max | 193 nm | 193 nm |

The composition for reflection-inhibiting film of the present invention can be effectively used for a process for forming a photoresist pattern using ArF light source.

As discussed earlier, polymers of the present invention, preferably, include a phenyl moiety which has a relatively high absorbancy of 193 nm light. The presence of a phenyl moiety increases absorbance of 193 nm wavelength light. Thus, polymers of the present invention are particularly useful as an ArF reflection-inhibiting film.

In addition, polymers of the present invention contain an epoxy group which allows it to form cross-linkages during the hard baking step. The cross-linkage provides forming ability, compactness and solubility resistance. The monomers used in the present invention are inexpensive, and therefore are economically advantageous. In addition, the monomers are designed to be suitable for a mass production. Moreover, a polymerization reaction can be performed in a single step.

The resin for reflection-inhibiting films in accordance with the present invention has an excellent solubility in most hydrocarbon solvents, but becomes insoluble after the hard baking step. Thus, they are not affected by the solvent that is present in a photoresist composition that is coated over the reflection-inhibiting film. In addition, no chemical substance is generated from the resins of the present invention when forming a cross-linked structure, thereby preventing the cutting and footing phenomena during a pattern-forming process. Furthermore, the epoxy group enhances adhesiveness to the lower film, and a hydroxyl group is generated during the cross-linking process thereby maintaining the adhesiveness. Preferably, the polymers for reflection-inhibiting film of the invention comprise acrylate- and styrene-based monomers, and thus have a higher etching speed in the etching step than the photosensitive film, thereby increasing the etching selection value.

What is claimed is:

1. A composition for reducing the light reflection in a photoresist pattern formation comprising:

(a) a polymer of Chemical Formula 1,

Chemical Formula 1

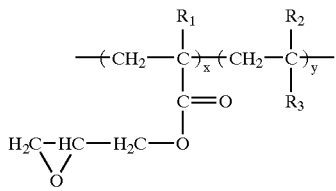

wherein each of $R_1$ and $R_2$ is independently hydrogen, hydroxy, —CH$_2$OH or —(CH$_2$)$_n$CH$_3$;

$R_3$ is

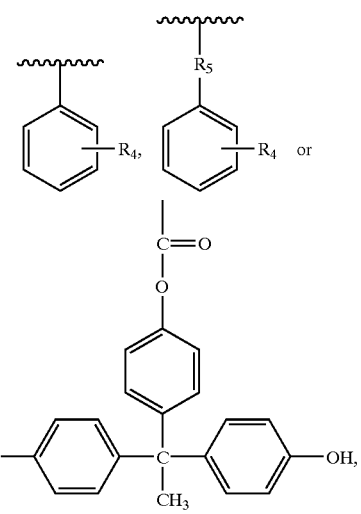

wherein $R_4$ is hydrogen, —OCH$_3$, —(CH$_2$)$_n$CH$_3$, —(CH$_2$)$_n$—OH,

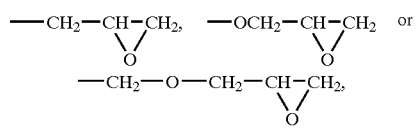

and $R_5$ is —COO— or —(CH$_2$)$_n$CH$_2$—;

n is an integer from 0 to 3; and x and y represent the relative amounts of each monomer, wherein the mole ratio of x:y is 0.0–0.9:0.1–1.0; provided that when x=0, then $R_3$ is

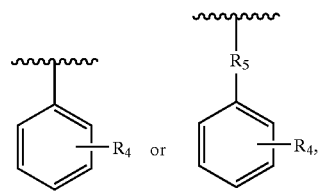

and $R_4$ is

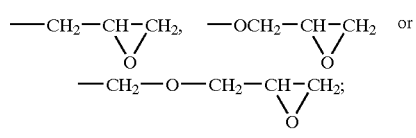

(b) a thermal acid generator selected from the group consisting of:

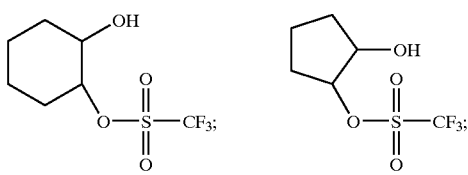

-continued

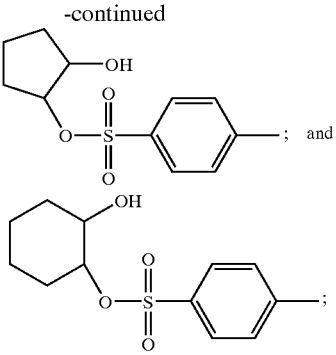

; and

;

(c) an organic solvent; and optionally (d) a polymer having hydroxyl group as a functional group.

2. The composition according to claim 1, wherein the polymer of Chemical Formula 1 is selected from the group consisting of:

poly(glycidyl methacrylate/α-methyl styrene);

poly(glycidyl acrylate/acryloyl phenoxy bis(-4-hydroxy phenyl)ethane);

poly(glycidyl methacrylate/glycidyl methyl styrene);

polyglycidyl methyl styrene;

poly(styrene/glycidyl methyl styrene);

poly(glycidyl methacrylate/vinylanisole); and poly(glycidyl methacrylate/vinylbenzoate).

3. The composition according to claim 1, wherein the polymer of Chemical Formula 1 has a weight average molecular weight of 2,000 to 50,000.

4. The composition according to claim 1, wherein the thermal acid generator is used in an amount ranging from about 2 to about 30 wt % of the polymer of Chemical Formula 1.

5. The composition according to claim 1, wherein the organic solvent is selected from the group consisting of propylene glycol methyl ether acetate (PGMEA), methyl 3-methoxypropionate (MMP), ethyl 3-ethoxypropionate (EEP), cyclohexanone and mixtures thereof.

6. The composition according to claim 1, wherein the organic solvent is used in an amount ranging from about 3000 to about 7000 wt % of the polymer of Chemical Formula 1.

7. The composition according to claim 1, wherein the polymer having hydroxyl group further comprises phenyl group.

8. The composition according to claim 1, wherein the polymer having hydroxyl group comprises a repeating unit of polyvinyl phenol represented by the following Chemical Formula 11:

[Chemical Formula 11]

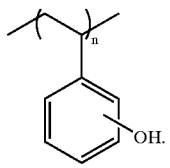

9. The composition according to claim 1, wherein the polymer comprising hydroxyl group is used in an amount of about 50 to about 200 wt % of the polymer of Chemical Formula 1.

* * * * *